(12) United States Patent
Tzannes (10) Patent No.: US 10,049,003 B2
(45) Date of Patent: Aug. 14, 2018

(54) CRC COUNTER NORMALIZATION (71) Applicant: TQ DELTA, LLC, Austin, TX (US)

(72) Inventor: Marcos C. Tzannes, Petaluma, CA (US)

(73) Assignee: TQ DELTA, LLC, Austin, TX (US)

( * ) Notice: Subject to any disclaimer, the term of this patent is extended or adjusted under 35 U.S.C. 154(b) by 0 days.

(21) Appl. No.: 15/062,522

(22) Filed: Mar. 7, 2016

(65) Prior Publication Data

US 2016/0188403 A1 Jun. 30, 2016

Related U.S. Application Data

(63) Continuation of application No. 14/638,889, filed on Mar. 4, 2015, now Pat. No. 9,300,324, which is a continuation of application No. 14/338,503, filed on Jul. 23, 2014, now Pat. No. 8,984,366, which is a continuation of application No. 13/968,880, filed on Aug. 16, 2013, now Pat. No. 8,793,553, which is a continuation of application No. 13/156,098, filed on
(Continued)

(51) Int. Cl.
*G06F 11/10* (2006.01)
*H03M 13/09* (2006.01)
*H04L 1/00* (2006.01)

(52) U.S. Cl.
CPC ......... *G06F 11/1004* (2013.01); *H03M 13/09* (2013.01); *H03M 13/096* (2013.01); *H04L 1/0045* (2013.01); *H04L 1/0061* (2013.01)

(58) Field of Classification Search
CPC ... H04L 1/0007; H04L 1/0045; H04L 1/0061; H04L 1/0096; H04L 1/18; H03M 13/09; H03M 13/096; G06F 11/1004
See application file for complete search history.

(56) References Cited

U.S. PATENT DOCUMENTS 3,889,109 A 6/1975 Blessin
4,800,559 A 1/1989 Florea et al.
(Continued)

FOREIGN PATENT DOCUMENTS

CN 1409503 4/2003
GB 2390513 1/2004
(Continued)

OTHER PUBLICATIONS

Notification of Reasons for Refusal (including translation) for Japanese Patent Application No. 2015-105633, dated Feb. 22, 2016.
(Continued)

*Primary Examiner* — Shelly A Chase
(74) *Attorney, Agent, or Firm* — Jason H. Vick; Sheridan Ross, PC (57) ABSTRACT

The ability to accurately and efficiently calculate and report communication errors is becoming more important than ever in today's communications environment. More specifically calculating and reporting CRC anomalies in a consistent manner across a plurality of communications connections in a network is crucial to accurate error reporting. Through a normalization technique applied to a CRC computation period (e.g., the PERp value), accurate error identification and reporting for each individual connection can be achieved.

20 Claims, 5 Drawing Sheets

Related U.S. Application Data

Jun. 8, 2011, now Pat. No. 8,516,337, which is a continuation of application No. 12/783,771, filed on May 20, 2010, now Pat. No. 7,979,778, which is a continuation of application No. 12/236,902, filed on Sep. 24, 2008, now Pat. No. 7,925,958, which is a continuation of application No. 11/232,899, filed on Sep. 23, 2005, now Pat. No. 7,451,379.

(60) Provisional application No. 60/613,594, filed on Sep. 25, 2004.

(56) References Cited

U.S. PATENT DOCUMENTS

| | | |
|---|---|---|
| 4,979,174 A | 12/1990 | Cheng et al. |
| 5,214,501 A | 5/1993 | Cavallerano et al. |
| 5,220,567 A | 6/1993 | Dooley et al. |
| 5,287,384 A | 2/1994 | Avery et al. |
| 5,329,520 A | 7/1994 | Richardson |
| 5,351,016 A | 9/1994 | Dent |
| 5,420,640 A | 5/1995 | Munich et al. |
| 5,422,913 A | 6/1995 | Wilkinson |
| 5,453,989 A | 9/1995 | Kitayama et al. |
| 5,509,020 A | 4/1996 | Iwakiri et al. |
| 5,566,206 A | 10/1996 | Butler et al. |
| 5,596,604 A | 1/1997 | Cioffi et al. |
| 5,613,061 A | 3/1997 | Taylor |
| 5,635,864 A | 6/1997 | Jones |
| 5,671,255 A | 9/1997 | Wang et al. |
| 5,675,585 A | 10/1997 | Bonnot et al. |
| 5,745,275 A | 4/1998 | Giles et al. |
| 5,751,338 A | 5/1998 | Ludwig, Jr. |
| 5,751,725 A | 5/1998 | Chen |
| 5,764,649 A | 6/1998 | Tong |
| 5,764,693 A | 6/1998 | Taylor et al. |
| 5,793,759 A | 8/1998 | Rakib et al. |
| 5,835,527 A | 11/1998 | Lomp |
| 5,848,073 A | 12/1998 | Abdelmonem et al. |
| 5,903,612 A | 5/1999 | Van Der Puttent et al. |
| 5,905,874 A | 5/1999 | Johnson |
| 5,917,340 A | 6/1999 | Manohar et al. |
| 5,936,972 A | 8/1999 | Meidan et al. |
| 5,995,539 A | 11/1999 | Miller |
| 6,041,057 A | 3/2000 | Stone |
| 6,065,149 A | 5/2000 | Yamanaka |
| 6,081,291 A | 6/2000 | Ludwig, Jr. |
| 6,088,337 A | 7/2000 | Eastmond et al. |
| 6,094,441 A | 7/2000 | Jung et al. |
| 6,094,465 A | 7/2000 | Stein et al. |
| 6,128,763 A | 10/2000 | LoGalbo et al. |
| 6,175,590 B1 | 1/2001 | Stein |
| 6,226,322 B1 | 5/2001 | Mukherjee |
| 6,308,278 B1 | 10/2001 | Khouli et al. |
| 6,421,323 B1 | 7/2002 | Nelson et al. |
| 6,473,418 B1 | 10/2002 | Laroia et al. |
| 6,519,738 B1 | 2/2003 | Derby |
| 6,546,509 B2 | 4/2003 | Starr |
| 6,578,162 B1 | 6/2003 | Yung |
| 6,598,189 B1 | 7/2003 | Zhao et al. |
| 6,640,239 B1 | 10/2003 | Gidwani |
| 6,657,949 B1 | 12/2003 | Jones, IV et al. |
| 6,662,322 B1 | 12/2003 | Abdelilah et al. |
| 6,721,338 B1 | 4/2004 | Sato |
| 6,734,810 B2 | 5/2004 | Kajita et al. |
| 6,745,148 B2 | 6/2004 | Abramovitch |
| 6,754,290 B1 | 6/2004 | Halter |
| 6,760,877 B1 | 7/2004 | Lappetelainen et al. |
| 6,820,232 B2 | 11/2004 | Kim et al. |
| 6,904,537 B1 | 6/2005 | Gorman |
| 6,934,885 B2 | 8/2005 | Gabele et al. |
| 7,010,001 B2 | 3/2006 | Odenwalder |
| 7,024,592 B1 | 4/2006 | Voas et al. |
| 7,032,157 B2 | 4/2006 | Kim et al. |
| 7,039,909 B2 | 5/2006 | Wu et al. |
| 7,103,822 B2 | 9/2006 | Glaise et al. |
| 7,200,138 B2 | 4/2007 | Liu |
| 7,203,206 B2 | 4/2007 | Amidan et al. |
| 7,206,291 B2 | 4/2007 | Soldani et al. |
| 7,228,491 B2 | 6/2007 | Oki |
| 7,302,379 B2 | 11/2007 | Cioffi et al. |
| 7,400,688 B2 | 7/2008 | Garrett |
| 7,451,379 B2 | 11/2008 | Tzannes |
| 7,487,430 B2 | 2/2009 | Kim et al. |
| 7,925,958 B2 | 4/2011 | Tzannes |
| 7,979,778 B2 | 7/2011 | Tzannes |
| 8,516,337 B2 | 8/2013 | Tzannes |
| 8,793,553 B2 | 7/2014 | Tzannes |
| 8,984,366 B2 | 3/2015 | Tzannes |
| 2002/0015401 A1 | 2/2002 | Subramanian et al. |
| 2003/0054770 A1 | 3/2003 | Cazzaniga et al. |
| 2003/0066016 A1 | 4/2003 | Wehage |
| 2003/0131209 A1 | 7/2003 | Lee |
| 2003/0185212 A1 | 8/2003 | Lamborne et al. |
| 2004/0116142 A1 | 6/2004 | Wang et al. |
| 2004/0120435 A1 | 6/2004 | Yang et al. |
| 2004/0198294 A1 | 10/2004 | Hagin-Metzer |
| 2005/0079889 A1 | 4/2005 | Vaglica et al. |
| 2006/0228113 A1 | 10/2006 | Cutillo et al. |
| 2006/0245366 A1 | 11/2006 | Binde |
| 2015/0180508 A1 | 6/2015 | Tzannes |

FOREIGN PATENT DOCUMENTS

| | | | |
|---|---|---|---|
| GB | 2390513 A * | 7/2004 | ............ H04L 1/00 |
| JP | 02-033237 | 2/1990 | |
| JP | H06-083728 | 3/1994 | |
| JP | 06-169302 | 6/1994 | |
| JP | 06-343069 | 12/1994 | |
| JP | 2000-332852 | 11/2000 | |
| JP | 2004-015807 | 1/2004 | |
| WO | WO 98/47238 | 10/1998 | |
| WO | WO 00/41395 | 7/2000 | |
| WO | WO 01/11833 | 2/2001 | |
| WO | WO 2004/029806 | 4/2004 | |
| WO | WO 2006/036723 | 4/2006 | |

OTHER PUBLICATIONS

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Feb. 9, 2016-Mar. 2, 2016—Docket Nos. 138-157; (228 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Aug. 31, 2015 and Mar. 17, 2016-Apr. 22, 2016—Docket Nos. 108 and 180-208; (194 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Feb. 9, 2016-Mar. 2, 2016—Docket Nos. 125-142; (225 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Mar. 17, 2016-Apr. 22, 2016; Docket Nos. 165-193; (152 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 9, 2016-Mar. 2, 2015; Docket Nos. 140-157; (223 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Mar. 17, 2016-Apr. 22, 2016; Docket Nos. 180-208; (152 pages).

(56) References Cited

OTHER PUBLICATIONS

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 9, 2016-Mar. 1, 2016 Docket Nos. 69-72; (13 pages).

Defendant Adtran, Inc.'s Preliminary Invalidity Contentions with Regard to Representative Asserted Claims for *TQ Delta, LLC v. Adtran, Inc.*—Including Claim Charts for Family 5 as Exhibits 5-1-5-10; U.S. District Court, for the District of Delaware (Wilmington); Civil Action No. 1:14-cv-00954-RGA and Civil Action No. 1:15-cv-00121-RGA; filed Feb. 9, 2016 (260 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jul. 17, 2014-Mar. 1, 2016 Docket Nos. 1-77; (1,444) pages).

Documents filed with District Court Proceedings for *Adtran Inc. vs. TQ Delta, LLC*; U.S. District Court, for the Northern District of Alabama (Northeastern); Civil Action No. 5:14-cv-01381-JEO; Includes documents filed from Jul. 17, 2014-Jan. 27, 2015—Docket Nos. 1-32 (568 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Feb. 25, 2016, mailed publically available on May 25, 2016 Docket No. 155 (40 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Apr. 27, 2016-May 24, 2016; Docket Nos. 209-226; (813 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Mar. 6, 2016—made publically available Jun. 1, 2016 Docket Nos. 158; (61 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jun. 3, 2016-Jun. 6, 2016; Docket Nos. 227-228; (67 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Feb. 25, 2016, made publically available May 25, 2016; Docket No. 140; (40 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Apr. 27, 2016-May 24, 2016; Docket Nos. 194-211; (813 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Mar. 3, 2016 made publically available Jun. 1, 2016; Docket Nos. 143; (61 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Jun. 3, 2016-Jun. 7, 2016; Docket Nos. 212-215; (138 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Feb. 25, 2016, made publically available May 25, 2016; Docket No. 155; (40 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Apr. 27, 2016-May 24, 2016; Docket Nos. 209-226; (809 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Mar. 3, 2016, made publically Jun. 1, 2016; Docket No. 158; (61 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jun. 3, 2016-Jun. 13, 2016; Docket Nos. 227-232; (140 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Mar. 28, 2016-May 31, 2016—Docket Nos. 74-77; (8 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Mar. 8, 2016, made publically available Jun. 6, 2016—Docket No. 73; (60 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jun. 7, 2016-Jun. 8, 2016; Docket Nos. 78-80; (73 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Mar. 28, 2016-May 31, 2016; Docket Nos. 79-82; (8 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents on Mar. 8, 2016 made publically available Jun. 6, 2016; Docket Nos. 78; (60 pages).

Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jun. 7, 2016-Jun. 8, 2016; Docket Nos. 83-85; (73 pages).

Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Jun. 27, 2016; Docket Nos. 229; (2 pages).

Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Jun. 27, 2016; Docket Nos. 216; (2 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jun. 14, 2016; Docket Nos. 233; (2 pages).

Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Jun. 27, 2016; Docket Nos. 235; (2 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jun. 15, 2016; Docket Nos. 81; (2 pages).

Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed on Jun. 27, 2016; Docket Nos. 82; (2 pages).

Documents filed with District Court Proceedings for *Adtran Inc. v. TQ Delta, LLC*; U.S. District Court, for the District of Delaware (Wilmington); Civil Action No. 1:15-cv-00121-RGA; includes documents filed from Jun. 15, 2016; Docket Nos. 86; (2 pages).

(56) References Cited

OTHER PUBLICATIONS

Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed on Jun. 27, 2016; Docket Nos. 87; (2 pages).
Intention to Grant for European Patent Application No. 11005906.0, dated Jun. 29, 2016.
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed on Aug. 2-Sep. 14, 2016; Docket Nos. 230-236; (58 pages).
Documents filed with District Court Proceedings for *TQ Delta, LLC* v. *Zhone Technologies Inc.*; U.S. District Court, for the District of Delaware (Wilmington); Civil Action No. 1:13-cv-01836-RGA; Includes documents filed from Aug. 2-Aug. 23, 2016; Docket Nos. 217-219; (9 pages).
Documents filed with District Court Proceedings for *TQ Delta, LLC* v. *Zhone Technologies Inc.*; U.S. District Court, for the District of Delaware (Wilmington); Civil Action No. 1:13-cv-01836-RGA; Includes documents filed from Sep. 16, 2016; Docket Nos. 220; (2 pages).
Documents filed with District Court Proceedings for *TQ Delta, LLC* v. *Zyxel Communications Inc. et al.*; U.S. District Court, for the District of Delaware (Wilmington); Civil Action No. 1:13-cv-02013-RGA; Includes documents filed from Aug. 2, 2016-Sep. 1, 2016; Docket Nos. 236-239; (11 pages).
Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents filed from Aug. 2-Sep. 1, 2016; Docket Nos. 83-86; (11 pages).
Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Aug. 2-Sep. 1, 2016; Docket Nos. 88-91: (11 pages).
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed on Sep. 26, 2016; Docket Nos., 238-239; (19 pages).
Documents filed with District Court Proceedings for *TQ Delta, LLC* v. *Zhone Technologies Inc.*; U.S. District Court, for the District of Delaware (Wilmington); Civil Action No. 1:13-cv-01836-RGA; Includes documents filed on Sep. 26, 2016; Docket Nos. 221-222; (19 pages).
Documents filed with District Court Proceedings for *TQ Delta, LLC* v. *Zyxel Communications Inc. et al.*; U.S. District Court, for the District of Delaware (Wilmington); Civil Action No. 1:13-cv-02013-RGA; Includes documents filed on Sep. 26, 2016; Docket Nos. 240-241; (19 pages).
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed from Oct. 26, 2016-Nov. 17, 2016; Docket Nos. 240-245; (37 pages).
Documents filed with District Court Proceedings for *TQ Delta, LLC* v. *Zhone Technologies Inc.*; U.S. District Court, for the District of Delaware (Wilmington); Civil Action No. 1:13-cv-01836-RGA; includes documents filed Oct. 26, 2016-Nov. 17, 2016; Docket Nos. 223-227; (35 pages).
Documents filed with District Court Proceedings for *TQ Delta, LLC* v. *Zyxel Communications Inc. et al.*; U.S. District Court, for the District of Delaware (Wilmington); Civil Action No. 1:13-cv-02013-RGA; Includes documents filed from Oct. 26, 2016-Nov. 17, 2016; Docket Nos. 242-246; (35 pages).
Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents filed from Nov. 4, 2016-Nov. 17, 2016; Docket Nos. 87-90; (11 pages).
Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Nov. 4, 2016-Nov. 17, 2016; Docket Nos. 92-95; (11 pages).
ITU-T Recommendation G.821 "Series G: Transmission Systems and Media, Digital Systems and Networks: Error Performance of an International Digital Connection Operating at a Bit Rate Below the Primary Rate and Forming Part of an Integrated Services Digital Network" Dec. 2002 (18 pages).
ITU-T Recommendation G.991.2 "Single-Pair High-Speed Digital Subscriber Line (SHDSL) Transceivers" International Telecommunication Union, Feb. 2001, p. 34, 2 pages.
Notification of Reasons for Refusal (including translation) for Japanese Patent Application No. 2015-105633, dated Jan. 30, 2017.
Documents filed with District Court Proceedings for *TQ Delta, LLC* v. *2Wire, Inc.*; U.S. District Court, for the District of Delaware (Wilmington); Civil Action No. 1:13-cv-01835-RGA; includes documents filed on Sep. 18, 2016 and made available on Dec. 19, 2016 Docket No. 237; (36 pages).
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed From Dec. 9, 2016-Feb. 3, 2017; Docket Nos. 246-265; (688 pages).
Documents filed with District Court Proceedings for *TQ Delta, LLC* v. *Zhone Technologies Inc.*; U.S. District Court, for the District of Delaware (Wilmington); Civil Action No. 1:13-cv-01836-RGA; Includes documents filed Dec. 9, 2016-Feb. 3, 2017; Docket Nos. 228-236; (21 pages).
Documents filed with District Court Proceedings for *TQ Delta, LLC* v. *Zyxel Communications Inc. et al.*; U.S. District Court, for the District of Delaware (Wilmington); Civil Action No. 1:13-cv-02013-RGA; Includes documents filed from Dec. 9, 2016-Feb. 3, 2017; Docket Nos. 247-256; (23 pages).
Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents filed from Dec. 9, 2016-Feb. 3, 2017; Docket Nos. 91-99; (19 pages).
Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Dec. 9, 2016-Feb. 3, 2017; Docket Nos. 96-104 (19 pages).
European Search Report for European Patent Application No. 16020487.1, dated May 2, 2017.
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed made available on Dec. 19, 2016; Docket No. 237; (36 pages).
Documents filed with District Court Proceedings for *TQ Delta, LLC* v. *2Wire, Inc.*; U.S. District Court, for the District of Delaware (Wilmington); Civil Action No. 1:13-cv-01835-RGA; Includes documents filed from Feb. 6, 2017 to May 1, 2017; Docket Nos. 266-286; (124 pages).
Defendant 2WIRE, Inc.'s Invalidity Contentions in Response to TQ Delta's Dec. 8, 2016 Final infringement Contentions for *TQ Delta, LLC* v. *2Wire, Inc.*—Including Claim Charts for Family 5 with Exhibits J-1 to J-6 and K-1 to K-4; In the United States District Court for the District of Delaware; Civil Action No. 13-01835-RGA; filed Jan. 23, 2017 (210 pages).
Documents filed with District Court Proceedings for *TQ Delta, LLC* v. *Zhone Technologies Inc.*, U.S. District Court, for the District of Delaware (Wilmington); Civil Action No. 1.13-cv-01836-RGA, Includes documents filed Feb. 8, 2017 to Apr. 26, 2017; Docket Nos. 237-253; (118 pages).
Defendant Zhone Technologies, Inc.'s Final Invalidity Contentions in Response to Plaintiff's Final Infringement Charts Regarding (56) References Cited

OTHER PUBLICATIONS

Non-Broadcom Products for *TQ Delta, LLC* v. *Zhone Technologies, Inc.*—Including Claim Charts for Family 5 with Exhibits 133-144; In the United States District Court for the District of Delaware; Civil Action No. 13-01836-RGA; filed Jan. 23, 2017 (222 pages).
Documents filed with District Court Proceedings for *TQ Delta, LLC* v. *Zyxel Communications Inc. et al.*; U.S. District Court, for the District of Delaware (Wilmington); Civil Action No. 1:13-cv-02013-RGA; Includes documents filed from Feb. 8, 2017-May 1, 2017; Docket Nos. 257-273; (69 pages).
Defendant Zyxel's Technologies, Inc.'s Final Invalidity Contentions in Response to Plaintiff's Dec. 8, 2016 Final Infringement Charts Regarding Non-Broadcom Products for *TQ Delta, LLC* v. *Zyxel Communications, Inc. and Zyxel Communications Corporation—* Including Claim Charts for Family 5 with Exhibits E1-E10; In the United States District Court for the District of Delaware; Civil Action No. 13-02013-RGA; filed Jan. 23, 2017 (250 pages).
Documents filed with District Court Proceedings for *TQ Delta, LLC* v. *Adtran Inc.*; U.S. District Court, for the District of Delaware (Wilmington); Civil Action No. 1:14-cv-00954-RGA; Includes documents filed from Feb. 8, 2017-May 1, 2017; Docket Nos. 100-118; (128 pages).
Documents filed with District Court Proceedings for *Adtran Inc.* v. *TQ Delta, LLC*; U.S. District Court, for the District of Delaware (Wilmington); Civil Action No. 1:15-cv-00121-RGA; Includes documents filed from Feb. 8, 2017-May 1, 2017; Docket Nos. 105-122 (118 pages).
U.S. Appl. No. 60/078,549, filed Mar. 19, 1998, Jacobsen et al.
Bauer, Rainer et al. "Iterative Source/Channel-Decoding Using Reversible Variable Length Codes" Munich University of Technology, 2000 (10 pages).
Business Wire "New FatPipe T1 Speed Product Produces Speeds up to 4.5Mbps and Redundancy for a Fraction of the Cost of a Fractional T3!" Business Wire, Oct. 16, 1998 (2 pages).
Castagnoli, Guy et al. "Optimization of Cyclic Redundancy-Check Codes with 24 and 32 Parity Bits" IEEE Transactions on Communications, vol. 42, No. 6, Jun. 1993 (10 pages).
Cisco Systems, Inc. "Alternatives for High Bandwidth Connections Using Parallel T1/E1 Links" 1998 (8 pages).
Civanlar, Seyhan "Self-Healing in Wideband Packet Networks" IEEE Network Magazine, Jan. 1990 (5 pages).
Huffman, W. Cary et al. "Fundamentals of Error Correcting Codes" Cambridge University Press 2003 (665 pages).
Goodman, David et al. "Maximizing the Throughput to CDMA Data Communications" Polytechnic University, Brooklyn, NY, Oct. 2003 (5 pages).
ITU-T Recommendation G.826 "End-to-End Error Performance Parameters and Objectives for International, Constant Bit-Rate Digital Paths and Connections" Dec. 2002 (34 pages).
ITU-T Recommendation G.991.2 "Single-Pair High-Speed Digital Subscriber Line (SHDSL) Transceivers" International Telecommunication Union, Dec. 2003, 234 pages.
International Telecommunication Union, Recommendation G.992.3, Series G: Transmission Systems and Media, Digital Systems and Networks, Jul. 2002, 312 pages.
ITU-T Recommendation G.992.3, "Asymmetric Digital Subscriber Line Transceivers 2 (ADSL2)" International Telecommunication Union, Apr. 2009, 404 pages.
ITU-T Recommendation G.992.3 Annex C, "Annex C: Specific Requirements for an ADSL System Operating in the Same Cable as ISDN as Defined in Appendix III of Recommendation ITU-T G.961" International Telecommunication Union, Apr. 2009, 296 pages.
ITU-T Recommendation G.997.1 "Physical Layer Management for Digital Subscriber Line (DSL) Transceivers" May 2003 (74 pages).
ITU-T Recommendation G.997.1 Amendment 2 "Physical Layer Management for Digital Subscriber Line (DSL) Transceivers" Jan. 2005 (12 pages).
ITU-T Recommendation G.997.1 "Physical Layer Management for Digital Subscriber Line (DSL) Transceivers" Jun. 2012 (150 pages).

ITU-T SG 15/Q4 Contribution, COM 15-D1185-E "VDSL2: Proposal on VDSL2 Framing" Geneva, Apr. 19-30, 2004 (7 pages).
ITU SG 15—Temporary Document SI-064R1 "ADSL: CRC Counter Normalization Procedure for SRA and DRR" Stresa, Italy—Oct. 18-22, 2004 (3 pages).
ITU SG 15—Temporary Document LB-U19R1 "G.ploam.bis Issues List" Leuven, Belgiu, Jun. 14-18, 2004 (4 pages).
Johns, David A., et al. "Integrated Circuits for Data Transmission Over Twisted-Pair Channels" IEEE Journal of Solid-State Circuits, vol. 32, Nov. 3, Mar. 1997 (9 pages).
Koopman, Philip "32-Bit Cyclic Redundancy Codes for Internet Applications" The International Conference on Dependable Systems and Networks, 2002 (11 pages).
Koopman, Philip et al. "Cyclic Redundancy Code (CRC) Polynomial Selection for Embedded Networks" The International Conference on Dependable Systems and Networks, 2004 (11 pages).
Peterson, W.W. et al. "Cyclic Codes for Error Detection" Proceedings of the IRE, Jan. 1961 (8 pages).
Petzold, Mark C. et al. "Multicarrier Spread Spectrum Performance in Fading Channels with Serial Concatenated Convolutional Coding" IEEE 1998 (4 pages).
Pyle, Ray et al. "Network Management Standards: Approaches by T1M1 and an LEC Perspective" IEEE 1990 (3 pages).
Ray, B. et al. "Definitions of Managed Objects for High Bit-Rate DSL—2nd Generation (HDSL2) and Single-Pair High-Speed Digital Subscriber Line (SHDSL) Lines" IEFT Network Working Group, May 2002 (62 pages).
Sklower, K. et al. "The PPP Multilink Protocol (MP)" Network Working Group, Nov. 1994 (15 pages).
Wolman, Alec et al. "Latency Analysis of TCP on an ATM Network" University of Washington, Printed Sep. 19, 2014 (14 pages).
International Search Report for International (PCT) Patent Application No. PCT/US2005/033922, dated Feb. 23, 2006.
Written Opinion for International (PCT) Patent Application No. PCT/US2005/033922, dated Feb. 23, 2006.
International Preliminary Report on Patentability for International (PCT) Patent Application No. PCT/US2005/033922, dated Apr. 5, 2007.
Examiner's First Report for Australian Patent Application No. 2005289753, dated Oct. 2, 2007.
Notice of Acceptance for Australian Patent Application No. 2005289753, dated Nov. 25, 2008.
Examiner's First Report for Australian Patent Application No. 2009200784, dated Jul. 14, 2010.
Notice of Allowance for Canadian Patent Application No. 2,550,263, dated Feb. 18, 2010.
Official Action for Canadian Patent Application No. 2,711,718, dated Dec. 12, 2012.
Official Action for Canadian Patent Application No. 2,711,718, dated Oct. 4, 2013.
Notice of Allowance for Canadian Patent Application No. 2,711,718, dated Jul. 3, 2014.
Notice of Allowance for Canadian Patent Application No. 2,876,137, dated Jan. 22, 2016.
First Office Action for Chinese Patent Application No. 200580008869.X, dated Oct. 23, 2009.
Second Office Action (including English translation) for Chinese Patent Application No. 200580008869.X, dated May 27, 2010.
Notification of Granting a Patent Right for Chinese Patent Application No. 200580008869.X, dated Dec. 27, 2011.
First Official Action (including translation) for Chinese Patent Application No. 201210063701.0 dated Apr. 3, 2014.
Second Official Action (including translation) for Chinese Patent Application No. 201210063701.0 dated Nov. 2, 2014.
Notification to Grant (including translation) for Chinese Patent Application No. 201210063701.0 dated Jul. 17, 2015.
Official Action for European Patent Application No. 05799765.2, dated Jul. 12, 2010.
Official Communication for European Patent Application No. 05799765.2, dated Mar. 18, 2011.
Extended European Search Report for European Patent Application No. 11005906.0, dated Sep. 27, 2011.

(56) References Cited

OTHER PUBLICATIONS

First Examination Report for Indian Patent Application No. 1601/KOLNP/2006, dated Mar. 4, 2013.
Order and Notice of Reasons for Rejection (including English translation) for Japanese Patent Application No. 2006-551651, drafted Jan. 5, 2009.
Notification of Reason for Refusal (including English translation) for Japanese Patent Application No. 2006-551651, dated Oct. 26, 2009.
Order and Notice of Reasons for Rejection (including English Translation) for Japanese Patent Application No. 2006-345676, dated Jan. 5, 2009.
Notification of Reason for Refusal (including English translation) for Japanese Patent Application No. 2006-345676, dated Oct. 26, 2009.
Notification of Reasons for Refusal (including English translation) for Japanese Patent Application No. 2010-042193, dated Mar. 5, 2012.
Notice of Allowance for Japanese Patent Application No. 2010-042193, dated Mar. 11, 2013.
Notification of Reasons for Refusal (including English translation) for Japanese Patent Application No. 2012-194723, dated Nov. 11, 2013.
Notification of Reasons for Refusal (including English translation) for Japanese Patent Application No. 2012-194723, dated Nov. 25, 2014.
Final Office Action (including English translation) for Japanese Patent Application No. 2012-194723, dated Aug. 31, 2015.
Notice of Allowance (including English translation) for Japanese Patent Application No. 2012-194723, dated Oct. 5, 2015.
Office Action (including English translation) for Korean Patent Application No. 2006-7011697, dated Jan. 15, 2010.
Notice of Allowance (including English translation) for Korean Patent Application No. 10-2006-7011697, dated Apr. 12, 2010.
Official Action (including English translation) for Korean Patent Application No. 10-2010-7005285, dated Apr. 28, 2010.
Official Action (including English translation) for Korean Patent Application No. 10-2010-7005285, dated Feb. 25, 2011.
Notice of Refusal for Korean Patent Application No. 10-2010-7005285, dated Jul. 25, 2011.
Official Action (including English translation) for Korean Patent Application No. 10-2010-7024190, dated Jan. 3, 2011.
Notice of Refusal for Korean Patent Application No. 10-2010-7024190, dated Jul. 25, 2011.
Official Action for U.S. Appl. No. 11/232,899, dated May 7, 2008.
Notice of Allowance for U.S. Appl. No. 11/232,899, dated Aug. 13, 2008.
Official Action for U.S. Appl. No. 12/236,902, dated Sep. 2, 2010.
Notice of Allowance for U.S. Appl. No. 12/236,902, dated Feb. 23, 2011.
Official Action for U.S. Appl. No. 12/783,771, dated Oct. 25, 2010.
Notice of Allowance for U.S. Appl. No. 12/783,771, dated Jun. 3, 2011.
Official Action for U.S. Appl. No. 13/156,098 dated Oct. 22, 2012.
Notice of Allowance for U.S. Appl. No. 13/156,098 dated Jun. 10, 2013.
Official Action for U.S. Appl. No. 13/968,880 dated Oct. 21, 2013.
Notice of Allowance for U.S. Appl. No. 13/968,880 dated Jun. 6, 2014.
Official Action for U.S. Appl. No. 14/338,503, dated Oct. 17, 2014.
Notice of Allowance for U.S. Appl. No. 14/338,503, dated Dec. 4, 2014.
Notice of Allowance for U.S. Appl. No. 14/638,889, dated Nov. 6, 2015.
Notice of Allowance for U.S. Appl. No. 14/638,889, dated Jan. 14, 2016.
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Nov. 4, 2013-Oct. 19, 2015—Docket Nos. 1-122; (3,844 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Nov. 10, 2015-Jan. 5, 2016—Docket Nos. 123-129; (102 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Jan. 20, 2016-Feb. 2, 2016—Docket Nos. 131-137; (104 pages).
Defendant 2Wire, Inc.'s Preliminary Invalidity Contentions with Regard to Representative Asserted Claims for *TQ Delta, LLC v. 2Wire, Inc.*—Including Claim Charts for Family 5 with Exhibits J-1 to J-6 and K-1 to K-4; In the United States District Court for the District of Delaware; Civil Action No. 13-01835-RGA; filed Sep. 24, 2015 (191 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Nov. 4, 2013-Nov. 30, 2015—Docket Nos. 1-100; (1722 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Dec. 16, 2015-Jan. 6, 2016—Docket Nos. 104-112; (193 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed from Jan. 20, 2016-Feb. 8, 2016—Docket Nos. 113-124; (252 pages).
Defendant Zhone Technologies, Inc.'s Invalidity Contentions with Regard to Representative Asserted Claims for *TQ Delta, LLC v. Zhone Technologies, Inc.*—Including Claim Charts for Family 5 with Exhibits 102-113; In the United States District Court for the District of Delaware; Civil Action No. 13-01836-RGA; filed Sep. 25, 2015 (226 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 9, 2013-Nov. 30, 2015—Docket Nos. 1-117; (1996 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Dec. 16, 2015-Dec. 16, 2015—Docket Nos. 119; (48 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jan. 20, 2016-Feb. 8, 2016—Docket Nos. 125-139; (349 pages).
Defendant Zyxel's Initial Invalidity Contentions with Respect to Representative Asserted Claims for *TQ Delta, LLC v. Zyxel Communications, Inc. and Zyxel Communications Corporation*—Including Claim Charts for Family 5 with Exhibits E1-E10; In the United States District Court for the District of Delaware; Civil Action No. 13-02013-RGA; filed Sep. 25, 2015 (240 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jul. 17, 2014-Oct. 19, 2015—Docket Nos. 1-65; (2,489 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jan. 20, 2016-Feb. 8, 2016—Docket Nos. 67-68; (81 pages).
Documents filed with District Court Proceedings for *TQ Delta, LLC v. 2Wire, Inc.*; U.S. District Court, for the District of Delaware (56) References Cited

OTHER PUBLICATIONS (Wilmington); Civil Action No. 1:13-cv-01835-RGA; Includes documents filed from Jul. 24, 2017-Oct. 26, 2017; Docket Nos. 336-389; (3953 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Jul. 24, 2017-Oct. 25, 2017; Docket Nos. 300-352; (3668 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Jul. 24, 2017-Oct. 25, 2017; Docket Nos. 321-372; (3670 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Jul. 21, 2017-Oct. 26, 2017; Docket Nos. 168-233; (4038 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Jul. 21, 2017-Oct. 26, 2017; Docket Nos. 170-235 (4150 pages).
Grounds of Invalidity for *TQ Delta, LLC* vs. *Zyxel Communications UK Limited et al.* In the High Court of Justice Chancery Division Patent Court; Claim No. HP-2017-000045, filed Sep. 26, 2017 (33 pages).
Grounds of Invalidity filed in the High Court of Justice Chancery Division Patents Court Between *TQ Detla LLC* and *Zyxel Communications UK Limited et al.*; Claim No. HP-2017-000045; filed Sep. 26, 2017.
Defense and Counterclaim filed in the High Court of Justice Chancery Division Patents Court Between *TQ Detla LLC* and *Zyxel Communications UK Limited et al.*; Claim No. HP-2017-000045; filed Sep. 26, 2017.
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Sep. 7, 2017 and made Publicly Available on Dec. 6, 2017; Docket No. 357; (156 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from Oct. 27, 2017-Dec. 21, 2017; Docket Nos. 390-451; (1,411 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Sep. 7, 2017, made Publicly Available on Dec. 6, 2017; Docket No. 323; (156 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Oct. 30, 2017-Dec. 5, 2017; Docket Nos. 353-375; (862 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Sep. 7, 2017, made Publicly Available on Dec. 6, 2017; Docket No. 342; (156 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Oct. 27, 2017-Dec. 21, 2017; Docket Nos. 373-434; (1,843 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Sep. 7, 2017, made Publicly Available on Dec. 6, 2017; Docket No. 197; (157 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Oct. 27, 2017-Dec. 21, 2017; Docket Nos. 234-290; (1664 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Sep. 7, 2017, made Publicly Available on Dec. 6, 2017; Docket No. 199; (157 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Oct. 27, 2017-Dec. 21, 2017; Docket Nos. 236-291 (1662 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed on Feb. 10, 2017, made available on May 11, 2017; Docket Nos. 269; (52 pages).
Documents filed with District Court Proceedings for *TQ Delta, LLC v. 2Wire, Inc.*; U.S. District Court, for the District of Delaware (Wilmington); Civil Action No. 1:13-cv-01835-RGA; Includes documents filed from May 2, 2017 to Jul. 14, 2017; Docket Nos. 287-335; (1183 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed on Feb. 10, 2017, made available on May 11, 2017; Docket Nos. 239; (52 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed May 2, 2017 to Jul. 14, 2017; Docket Nos. 254-299; (1080 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed on Feb. 10, 2017, made available on May 11, 2017; Docket Nos. 259; (52 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from May 2, 2017-Jul. 14, 2017; Docket Nos. 274-320; (1080 pages).
Documents filed with District Court Proceedings for *TQ Delta, LLC v. Adtran Inc.*; U.S. District Court, for the District of Delaware (Wilmington); Civil Action No. 1:14-cv-00954-RGA, Includes documents filed on Feb. 10, 2017, made available on May 11, 2017; Docket Nos. 102; (52 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from May 2, 2017-Jul. 14, 2017; Docket Nos. 119-167; (1087 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed on Feb. 10, 2017, made available on May 11, 2017; Docket Nos. 107; (52 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from May 2, 2017-Jul. 14, 2017; Docket Nos. 122-169 (1083 pages).
Examiner's Report for Canadian Patent Application No. 2,935,980, dated May 29, 2017.
Notification of Reasons for Refusal for Japanese Patent Application No. 2015-105633, dated Aug. 14, 2017.
Notice of Allowance (including translation) for Japanese Patent Application No. 2015-105633, dated Sep. 4, 2017.

(56) References Cited

OTHER PUBLICATIONS

Notification of Reasons for Refusal (including translation) for Japanese Patent Application No. 2016-162059, dated Jul. 31, 2017.
ITU-T Telecommunication Standardization Sector of ITU I.356 "Seris I: Integrated Services Digital Network: Overall Network Aspects and Functions—Performance Objectives: B-ISDN ATM Layer Cell Transfer Performance" Mar. 2000 (64 pages).
ITU-T Telecommunication Standardization Sector of ITU I.357 "Seris I: Integrated Services Digital Network: Overall Network Aspects and Functions—Performance Objectives: B-ISDN Semi-Permanent Connection Availability" Nov. 2000 (17 pages).
Documents filed with District Court Proceedings for *TQ Delta, LLC v. 2WIRE, Inc.*; U.S. District Court, for the District of Delaware (Wilmington); Civil Action No. 1:13-cv-01835-RGA; Includes documents filed from Feb. 1, 2018-Mar. 19, 2018; Docket Nos. 399, 430-431, and 453-504 (1,482 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents filed Feb. 1, 2018-Mar. 6, 2018; Docket Nos., 358, 376, and 377 (326 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Feb. 1, 2018-Mar. 19, 2018; Docket Nos. 378, 407-408; and 436-502; (4,366 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Feb. 1, 2018-Mar. 19, 2018; Docket Nos. 242; 266-267; and 292-359 (4,228 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Feb. 1, 2018-Mar. 19, 2018; Docket Nos. 242, 267-268, and 293-360 (4,228 pages).
Documents filed with District Court Proceedings for *TQ Delta, LLC v. 2WIRE, Inc.*; U.S. District Court, for the District of Delaware (Wilmington); Civil Action No. 1:13-cv-01835-RGA; Includes documents made Publicly Available on Mar. 26, 2018; Docket No, 452; (120 pages).
Documents filed with District Court Proceedings for *TQ Delta, LLC v. 2WIRE. Inc.*; U.S. District Court, for the District of Delaware (Wilmington); Civil Action No. 1:13-cv-01835-RGA; Includes documents made Publicly Available on Apr. 16, 2018; Docket No. 463; (145 pages).
Documents filed with District Court Proceedings for *TQ Delta, LLC v. 2WIRE, Inc.*; U.S. District Court, for the District of Delaware (Wilmington); Civil Action No. 1:13-cv-01835-RGA; Includes documents made Publicly Available on May 9, 2018; Docket No. 487; (52 pages).
Documents filed with District Court Proceedings for *TQ Delta, LLC v. 2WIRE, Inc.*; U.S. District Court, for the District of Delaware (Wilmington); Civil Action No, 1:13-cv-01835-RGA; Includes documents filed from Mar. 27, 2018-Jun. 11, 2018; Docket Nos. 505-530; (450 pages).
Documents filed with District Court Proceedings for *TQ Delta, LLC v. Zhone Technologies Inc.*; U.S. District Court, for the District of Delaware (Wilmington); Civil Action No. 1:13-cv-01836-RGA; Includes documents made Publicly Available on Mar. 26, 2018; Docket No. 378 (120 pages).
Documents filed with District Court Proceedings for *TQ Delta, LLC v. Zyxel Communications Inc, et al.*; U.S. District Court, for the District of Delaware (Wilmington); Civil Action No. 1:13-cv-02013-RGA; Includes documents made publicly available on Mar. 26, 2018; Docket No. 435; (120 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents made publicly available on Apr. 16, 2018; Docket No. 454; (145 pages).
Documents filed with District Court Proceedings for *TQ Delta, LLC v. Zyxel Communications Inc, et al.*; U.S. District Court, for the District of Delaware (Wilmington); Civil Action No. 1:13-cv-02013-RGA; Includes documents made publicly available on Apr. 17, 2018; Docket No. 454; (42 pages).
Documents filed with District Court Proceedings for *TQ Delta, LLC v. Zyxel Communications Inc. et al.*, U.S. District Court, for the District of Delaware (Wilmington); Civil Action No. 1:13-cv-02013-RGA, Includes documents made publicly available on May 10, 2018; Docket No. 482; (52 pages).
Documents filed with District Court Proceedings for *TQ Delta, LLC v. Zyxel Communications Inc. et al.*; U.S. District Court, for the District of Delaware (Wilmington); Civil Action No, 1:13-cv-02013-RGA; Includes documents made publicly available on May 14, 2018; Docket No. 485; (101 pages).
Documents filed with District Court Proceedings for *TQ Delta, LLC v. Zyxel Communications Inc. et al.*; U.S. District Court, for the District of Delaware (Wilmington); Civil Action No. 1:13-cv-02013-RGA; Includes documents filed from Mar. 29, 2018-Jun. 8, 2018; Docket Nos. 503-534; (465 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Mar. 26, 2018; Docket No. 291 (120 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on Apr. 16, 2018; Docket No. 310 (145 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on May 10, 2018; Docket No. 338 (52 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents made publicly available on May 14, 2018; Docket No. 342 (101 pages).
Documents filed with District Court Proceedings for *TQ Delta, LLC v. Adtran Inc.*; U.S. District Court, for the District of Delaware (Wilmington); Civil Action No. 1:14-cv-00954-RGA; Includes documents filed from Mar. 29, 2018-Jun. 7, 2018; Docket Nos. 360-419 (956 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents made publicly available on Mar. 26, 2018; Docket No. 292 (120 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents made publicly available on Apr. 16, 2018; Docket No. 313 (145 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents made publicly available on May 10, 2018; Docket No. 341 (52 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents made publicly available on May 14, 2018; Docket No. 345 (101 pages).
Documents filed with District Court Proceedings for *Adtran Inc. v. TQ Delta, LLC*; U.S. District Court, for the District of Delaware (Wilmington); Civil Action No. 1:15-cv-00121-RGA; Includes documents filed from Mar. 29, 2018-Jun. 7, 2018; Docket Nos. 361-420 (956 pages).

(56) References Cited

OTHER PUBLICATIONS

Yamazaki, Katsuyuki et al. "Studies on Network QOS for Constant Bit Rate Services in B-ISDN" (Includes English Translation of Abstract) The Institute of Electronics, Information and Communication Engineers; vol. 91, No. 473, pp. 19-24, IN91-156, 1991.
Notice of Allowance (including translation) for Japanese Patent Application No. 2016-162059, dated Apr. 9, 2018.

\* cited by examiner

CRC COUNTER NORMALIZATION

RELATED APPLICATION DATA

This application is a continuation of U.S. application Ser. No. 14/638,889, file Mar. 4, 2015, which is a continuation of U.S. application Ser. No. 14/388,503, filed Jul. 23, 2014, now U.S. Pat. No. 8,984,366, which is a continuation of U.S. application Ser. No. 13/968,880, filed Aug. 16, 2013, now U.S. Pat. No. 8,793,553, which is a continuation of U.S. application Ser. No. 13/156,098, filed Jun. 8, 2011, now U.S. Pat. No. 8,516,337, which is a continuation of U.S. application Ser. No. 12/783,771, filed May 20, 2010, now U.S. Pat. No. 7,979,778, which is a continuation of U.S. application Ser. No. 12/236,902, filed Sep. 24, 2008, now U.S. Pat. No. 7,925,958, which is a continuation of U.S. application Ser. No. 11/232,899, filed Sep. 23, 2005, now U.S. Pat. No. 7,451,379, which claims the benefit of and priority under 35 U.S.C. § 119(e) to U.S. Patent Application No. 60/613,594, filed Sep. 25, 2004, entitled "CRC Counter Normalization Method and System," each of which are incorporated herein by reference in their entirety.

BACKGROUND

Field of the Invention

This invention generally relates to communication systems. More particularly, an exemplary embodiment of this invention relates to anomaly detection in communications systems.

Description of Related Art

Cyclic Redundancy Checksum (CRC) error detection is a common method of detecting errors in a data stream transmitted over a communications channel. ITU standard G.992.3, which is incorporated herein by reference in its entirety, describes CRC operations for ADSL systems in section 7.7.1.2. As discussed in G.992.3, the transmitter computes the transmitter CRC bits based on the transmitted bit stream and sends the CRC bits to the receiver. The receiver also computes the CRC bits based on the received bit stream and compares the locally computed CRC bits to the received CRC bits that were sent from the transmitter. If the receiver and transmitter CRC bits are identical, then the CRC computation indicates that there are no errors in the received bit stream. If however the received and transmitted CRC bits are not identical, then the CRC computation indicates that there are errors in the received bit stream.

DSL systems, and communications systems in general, use CRC errors, which are also known as anomalies, to diagnose and detect problematic service conditions. These CRC anomalies are typically computed, counted and reported based on some fundamental assumptions on how often the CRCs are computed. For example, in an ADSL systems, such as those specified in G.992.3, Severely Errored Seconds (SESs) are defined as 18 or more CRC anomalies in a 1-second interval. This corresponds to approximately 30 percent of computed CRCs being in error if the CRC is computed every 17 ms. The G.992.3 ADSL standard requires that the CRC is computed every 15 to 20 msecs. In ADSL 2 and VDSL 2 systems, the period of the CRC computation is called the period of the overhead channel (PERp). The G.992.3 standard requires that:

15 ms≤PERp≤20 ms.

SUMMARY

Digital subscriber line service providers use CRC anomaly reporting as a way to diagnose and detect problematic service conditions. For example, an ADSL service provider may use SESs as a way to detect an ADSL connection that is experiencing problems. For example, an ADSL service provider may specify that if an ADSL subscriber is experiencing more than 30 SESs in a 1-minute period, the ADSL connection needs to be repaired. For this reason, it is important that an SES is reported in a consistent manner across all connections in the service provider network.

As discussed above, if an ADSL system is determining CRCs every 17 ms (the PERp as required by the standard), Severely Errored Seconds (SESs) are defined as 18 or more CRC anomalies in a 1-second interval, then an SES will occur whenever approximately 30 percent of the computed CRCs are in error in a 1-second interval. But if, for example, CRCs are computed every 2 ms, and a SES is still defined as 18 or more CRC anomalies in a 1-second interval, then 18 CRC anomalies will correspond to only 3.6 percent of a computed CRC being in error. In this case, the service provider may receive a repair alarm and dispatch a network technician to fix a connection that is only experiencing a small number of errors.

Most communications systems specify CRC operations in a manner that restricts the CRC computation to be within a specified and bounded repetition period or rate in order to provide consistent detection and diagnostic capabilities across all connections, such as DSL subscriber connections, in a network.

New designs and innovations in communications systems are making it more difficult to ensure that CRC computations are bounded in such a manner. For example, G.992.3 specifies Seamless Rate Adaptation (SRA) and Dynamic Rate Repartition (DRR) that allow an ADSL system to make seamless changes in data rates on-line. However, SRA and DRR modify the data rate without changing the framing parameters. As a result, the PERp will change in proportion to the data rate change.

For example, a data rate increase of 10 percent will cause the PERp to decrease by 10 percent. A problem is that since PERp is only allowed to vary between 15 and 20 ms, SRAs and DRRs are limited to small data rate changes, usually within 10 to 15 percent.

It is often desirable to have large data rate changes. Large data rate changes typically result in PERp values that are outside of the range of 10-20 ms. In this case, as discussed above, ADSL service providers will encounter problems with the diagnostic procedures which are based on CRC anomalies to detect problematic connections.

New communications systems, such as VDSL, VDSL2, and other higher-speed wired and wireless communications systems are specifying data rates that occupy a very large range, starting, for example, as low as 500 kbps and going as high as 100 mbps or more. With ranges this large, it is difficult to design a framing method for all possible data rates that includes a CRC procedure that restricts the CRC computation to be within a specified and bounded repetition period.

Part of this difficulty is attributable to the fact that the accuracy of the error detection of the CRC is correlated to the number of bits in the CRC computation period (the accuracy of the CRC error detection decreases as the number of bits in the CRC computation period increases). For example, if the CRC computation is done every 20 ms, and the data rate is 1 mbps, there will be 20,000 bits in every CRC computation period.

However, if the data rate is 100 mbps, and the CRC computation period is 20 ms, then there will be 20 million bits in every CRC computation period. Clearly, the CRC error detection capability will be decreased in the latter case. In general, under normal operating conditions, the one octet CRC used in DSL systems provides adequate error detection if the CRC computation period contains less than 100,000 bits.

Accordingly, an exemplary aspect of this invention relates to calculating and reporting communication errors. More particularly, an exemplary aspect of this invention relates to calculating and reporting CRC anomalies in a consistent manner for all communications connections in a network independent of data rate or the CRC computation period (e.g., the PERp value) of each individual connection.

Additional aspects of the invention relate to handling CRC anomalies (errors) in such a manner that they are reported in a consistent way regardless of the data rate or the CRC computation. An exemplary aspect defines a procedure for normalizing CRC anomaly counters based on an actual CRC computation period.

According to an additional exemplary aspect of this invention, the CRC anomaly counter normalization procedure normalizes the CRC anomaly counter based on the current, or actual, PERp value.

According to an additional exemplary aspect of this invention, CRC anomaly counter normalization procedures are applied to a plurality of communications devices in a network based at least on a data rate.

According to an additional exemplary aspect of this invention, different CRC anomaly counter normalization procedures are applied to each of a plurality of communications devices in a network based at least on a data rate.

These and other features and advantages of this invention are described in, or are apparent from, the following description of the embodiments.

BRIEF DESCRIPTION OF THE DRAWINGS

The embodiments of the invention will be described in detail, with reference to the following figures, wherein.

DETAILED DESCRIPTION

The exemplary embodiments of this invention will be described in relation to detecting errors in a wired and/or wireless communications environment. However, it should be appreciated, that in general, the systems and methods of this invention will work equally well for any type of communication system in any environment.

The exemplary systems and methods of this invention will be described in relation to DSL modems and associated communication hardware, software and communication channels. However, to avoid unnecessarily obscuring the present invention, the following description omits well-known structures and devices that may be shown in block diagram form or otherwise summarized.

For purposes of explanation, numerous details are set forth in order to provide a thorough understanding of the present invention. It should be appreciated however that the present invention may be practiced in a variety of ways beyond the specific details set forth herein.

Furthermore, while the exemplary embodiments illustrated herein show the various components of the system colocated, it is to be appreciated that the various components of the system can be located at distant portions of a distributed network, such as a telecommunications network and/or the Internet, or within a dedicated secure, unsecured and/or encrypted system. Thus, it should be appreciated that the components of the system can be combined into one or more devices, such as a modem, or colocated on a particular node of a distributed network, such as a telecommunications network. As will be appreciated from the following description, and for reasons of computational efficiency, the components of the system can be arranged at any location within a distributed network without affecting the operation of the system. For example, the various components can be located in a Central Office (CO or ATU-C) modem, a Customer Premises Modem (CPE or ATU-R), a DSL management device, or some combination thereof. Similarly, on or more functional portions of the system could be distributed between a modem and an associated computing device.

Furthermore, it should be appreciated that the various links, including communications channel 5, connecting the elements can be wired or wireless links, or any combination thereof, or any other known or later developed element(s) that is capable of supplying and/or communicating data to and from the connected elements. The term module as used herein can refer to any known or later developed hardware, software, firmware, or combination thereof that is capable of performing the functionality associated with that element. Furthermore, in order to simplify notation, throughout this specification the term PERp will be used to denote the CRC computation period. The terms determine, calculate and compute, and variations thereof, as used herein are used interchangeably and include any type of methodology, process, mathematical operation or technique.

An exemplary embodiment of the present invention relates to CRC normalization in asymmetric DSL (ADSL) service. However, and in general, it is to be appreciated that this methodology can be applied to any one or more of a communications line or digital communications line.

Figure 1:
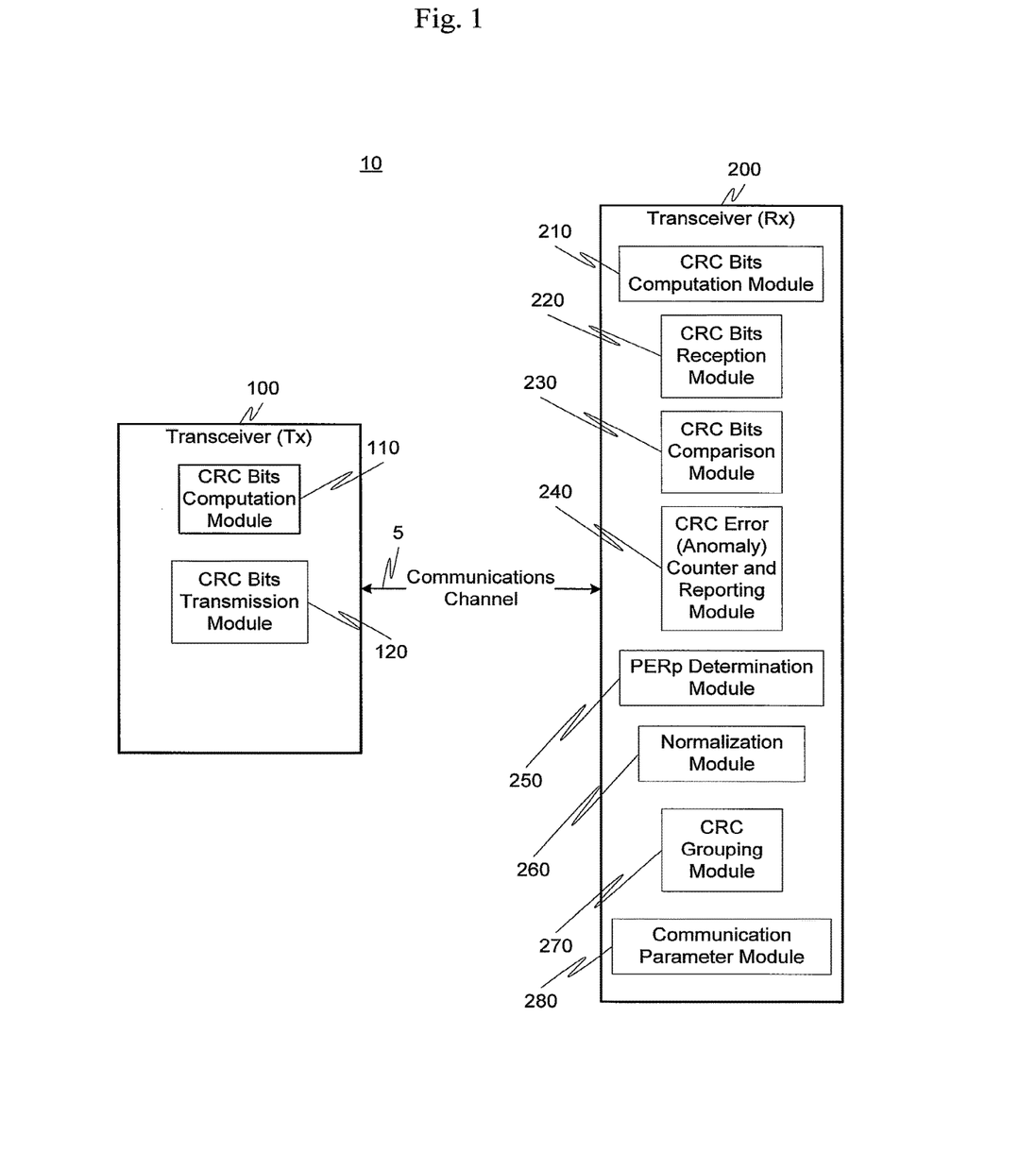
FIG. 1 is a functional block diagram illustrating an exemplary communication system according to this invention.

FIG. 1 illustrates an exemplary embodiment of the communication system 10 according to this invention. It should be appreciated that numerous functional components of the transceivers have been omitted for clarity. However, it should be understood that either transceiver can also include the standard components found in typical communications device(s) in which the technology of the subject convention is implemented into.

The communications system 10 includes a transceiver 100 and a transceiver 200. The transceiver 100, acting as a transmitting transceiver, includes a CRC bits computation module and a CRC bits transmission module. The two transceivers are interconnected by communications channel 5, which, as discussed above, can be one or more of a wire line and wireless communication channel. The transceiver 200 comprises a CRC bits computation module 210, a CRC bits reception module 220, a CRC bits comparison module 230, a CRC error counter and reporting module 240, a PERp determination module 250, a normalization module 260, a CRC grouping module 270 and a communication parameter module 280.

In accordance with an exemplary embodiment, a CRC anomaly is counted as:

PERp/$K$ normalized anomalies, where K is any positive integer. For example, if K=20 and the PERp=25, then each CRC anomaly is counted as 1.25 normalized CRC anomalies. In general, K will correspond to a value equal to an expected period of CRC computations based on which the system diagnostic information is reported. For example, in ADSL and VDSL systems, K can be equal to 15 ms since this corresponds to approximately 66 CRC computations per second. As discussed above, a Severely Errored Second is reported when there are more than 18 CRC anomalies in a second, which corresponds to approximately 30 percent of the CRC computations being in error.

Since CRC anomalies are typically reported as integer numbers, the accumulated CRC anomaly count can be rounded up to the next higher integer. For example, if the PERp=28, then each CRC anomaly is counted as 28/20=1.4 normalized CRC anomalies. If there 23 CRC anomalies detected over a period of time, the accumulated CRC anomaly counter could contain ceiling (23*1.4)=ceiling (32.2)=33 normalized CRC anomalies, where ceiling indicates a rounding in the upward direction.

In operation, the transceiver 100, which in this exemplary embodiment is operating as a transmitting transceiver or transmitting modem, computes CRC bits based on a transmitted bit stream. More specifically, a bit stream is transmitted from the transceiver 100 with the CRC bits computation module 110 determining CRC bits based on the transmitted bit stream. The number of CRC bits is usually 8(1 octed), however the number of bits can be varied based on, for example, the specific implementation of the invention. In conjunction with the CRC bits transmission module 120, the transceiver 100 sends the transmitted bit stream along with the corresponding computed CRC bits to transceiver 200 via communications channel 5.

The transceiver 200, which can also be referred to as the receiving transceiver or receiving modem, receives the bit stream transmitted by the transceiver 100 and, with the cooperation of the CRC bits reception module 220, the CRC bits that were determined by the CRC bits computation module 110. Upon receipt of the bit stream, the CRC bits computation module 210 also computes CRC bits (i.e., the local CRC bits) based on the received bit stream. Knowing the CRC bits determined by the CRC bit computation module 110, and the CRC bits computed by the CRC bit computation module 210, the CRC bits comparison module 230 performs a comparison between the two and, in conjunction with the CRC error counter and reporting module 240, computes and identifies a CRC anomaly when the local CRC bits are not identical to the received CRC bits determined in transceiver 100.

The PERp determination module 250 then determines a value for the period of a CRC computation (PERp). This period can be, for example, in seconds or in general any time period as appropriate for the particular communication environment. In conjunction with the normalization module 260, the CRC error counter and reporting module 240 is normalized based on the PERp value, where the normalizing of the CRC error counter 240 comprises incrementing the CRC error counter by a value of M wherein the value of M is:

PERp/$K$, where K is a positive integer.

The communication parameter module 280 monitors communication parameters, such as one or more of data rate, Forward Error Correction, interleaving, framing, or in general any communication parameter, and triggers the determination of an updated value for the period of a CRC computation should one or more of these parameters change. This updated or second value for the period is then used by the CRC anomaly counter for subsequent CRC anomaly counts.

In a second exemplary embodiment, CRC computations are combined into groups of ceiling(K/PERp) CRC computations and any number of CRC anomalies in a group is counted as only 1 normalized CRC anomaly, where K is a positive integer. In general, K will correspond to a value equal to an expected period of CRC computations based on which the system diagnostic information is reported in conjunction with the CRC error counter and reporting module 240. The CRC computations are grouped in this manner in order to avoid over counting the CRC anomalies in that multiple CRC anomalies that occur within a specific time period (e.g., K ms) may the need to be counted as a single normalized CRC anomaly.

Examples

K=15 ms and PERp=10 ms:
 CRC computations are combined in groups of ceiling(15/10)=2 CRC computations. The first 2 CRC computations are the first group, the second 2 CRC computations are the second group, and so on. One or more CRC anomalies in a group are counted as 1 normalized CRC anomaly.
K=25 and PERp=4 ms:
 CRC computations are combined in groups of ceiling(15/4)=4 CRC computations. The first 4 CRC computations are the first group, the second 4 CRC computations are the second group, and so on. One or more CRC anomalies in a group are counted as 1 normalized CRC anomaly If correct CRC computations are denoted as "o" and errored CRC computations (anomalies) as "x," then for the following stream of CRC computations:
 ooxxxooxoxoxxxxooooxxooxoooooo
if PERp=10, then 9 normalized CRC anomalies are counted:
 oo ox xx oo xo xo xx xx oo oo ox xo ox oo oo oo
If PERp=4, then 6 normalized CRC anomalies are counted:
 ooox xxoo xoxo xxxx oooo oxxo oxoo oooo The CRC computations could also be combined in groups based on some metric other than ceiling(K/PERp). For example, floor(K/PERp) could be used or 2*ceiling(K/PERp). In general, groups of CRC computations can be based on the metric:

$N$*ceiling($K$/PERp)

where, N and K are positive integer values and where floor indicates a rounding in the downward direction.

Alternatively, and in addition, the CRC anomalies in a group could be counted as more than 1 normalized CRC anomaly. For example, 1 CRC anomaly in a group could be counted as 1 normalized CRC anomaly. 2-3 CRC anomalies in a group could be counted as 2 normalized CRC anomalies. 4-6 CRC anomalies in a group could be counted as 4 normalized CRC anomalies, and so on.

Alternatively, and in addition, a sliding window could be used when grouping the CRC computations.

Alternatively, and in addition, the normalized CRC anomalies may be scaled again based on the time duration of the group of CRC computations. For example, if the PERp is equal to 14 ms, then the CRC computations are combined in groups of ceiling(14/15)=2 CRC computations. According to the method described above, 1 normalized CRC anomaly is counted for each group of 2 CRC computations containing at least 1 CRC anomaly. But combining the CRC computations into groups of 2 results in an effective CRC computation period of 2*14=28 ms which exceeds the 20 ms requirement of the G.992.3 standard. In this case, as was done above when PERp>20 ms, the CRC anomalies can be scaled again to make the CRC anomaly counts more accurate. For example, the 1 normalized CRC anomaly can be further scaled and counted as (28)/20=1.4 normalized CRC anomalies.

More generally, if the time duration of the group of CRC computations exceeds the required range (e.g. 20 ms for G.992.3 ADSL systems) then:

1 normalized group CRC anomaly=[(time duration of CRC group)/K] normalized CRC anomalies where K is a positive integer. For example K could also take on the values of 15, 17.5, or 20, which correspond to lower, middle and upper values in the range of the PERp values in the G.992.3 standard.

Using the G.992.3 ADSL standard as an example the values of PERp for which the normalized CRC anomalies could be determined and further scaled (or normalized) to account for the fact that the time duration of the CRC group is longer than 20 ms:

10<PERp<15

When the PERp value is greater than 10 and less than 15, each group of CRC computations will contain 2 CRC computations (as based on ceiling(15/PERp)). For this range of PERp values, the time duration of each CRC group will be longer than 20 ms. For example, if PERp=12 ms, then the time duration of the CRC group will be 2*(12 ms)=24 ms. In this case, the normalized CRC computations can be further normalized or scaled by 2*PERp/K, where K is equal to an integer such as 15, 17 or 20.

6.67<PERp<7.5

When the PERp value is greater than 6.67 and less than 7.5, each group of CRC computations will contain 3 CRC computations (as based on ceiling(15/PERp)). For this range of PERp values, the time duration of each CRC group will be longer than 20 ms. For example, if PERp=7 ms then the time duration of the CRC group will be 3*(7 ms)=21 ms. In this case the normalized CRC computations can be further normalized or scaled by 3*PERp/K, where K is equal to an integer such as 15, 17 or 20.

As a result, in one exemplary embodiment of this invention, normalized CRC anomalies in an ADSL or VDSL2 system are further normalized (or scaled) if the PERp value is between 10 and 15 ms or between 6.67 and 7.5 ms.

In another exemplary embodiment the PERp changes are based on a change in an on-line data rate, for example due to an SRA or a DRR change. In this case, the CRC normalization procedure would be updated based on the new PERp value, where the new PERp value is associated with the updated data rate.

Figure 2:
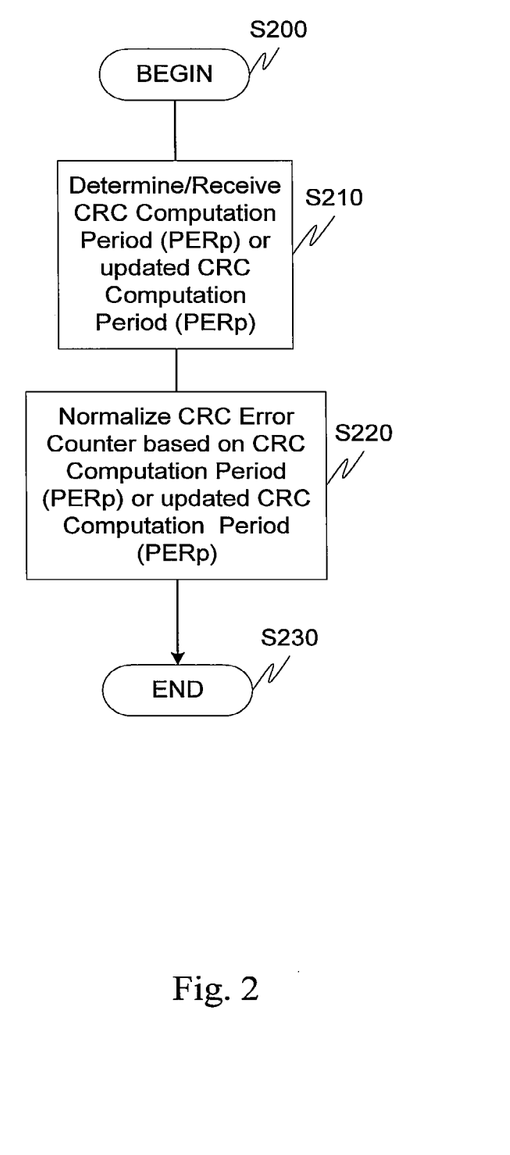
FIG. 2 is a flowchart outlining an exemplary method for normalizing a CRC counter according to this invention.

FIG. 2 outlines a high-level overview of an exemplary embodiment of CRC normalization according to this invention. In particular, control begins in S200 and continues to step S210. In step S210, a CRC computation period (PERp), or updated CRC computation period (PERp), is received or determined. Then, in step S220, the CRC error counter is normalized based on the CRC computation period (PERp) or the updated CRC computation period (PERp). Control then continues to step S230 where the control sequence ends.

Figure 3:
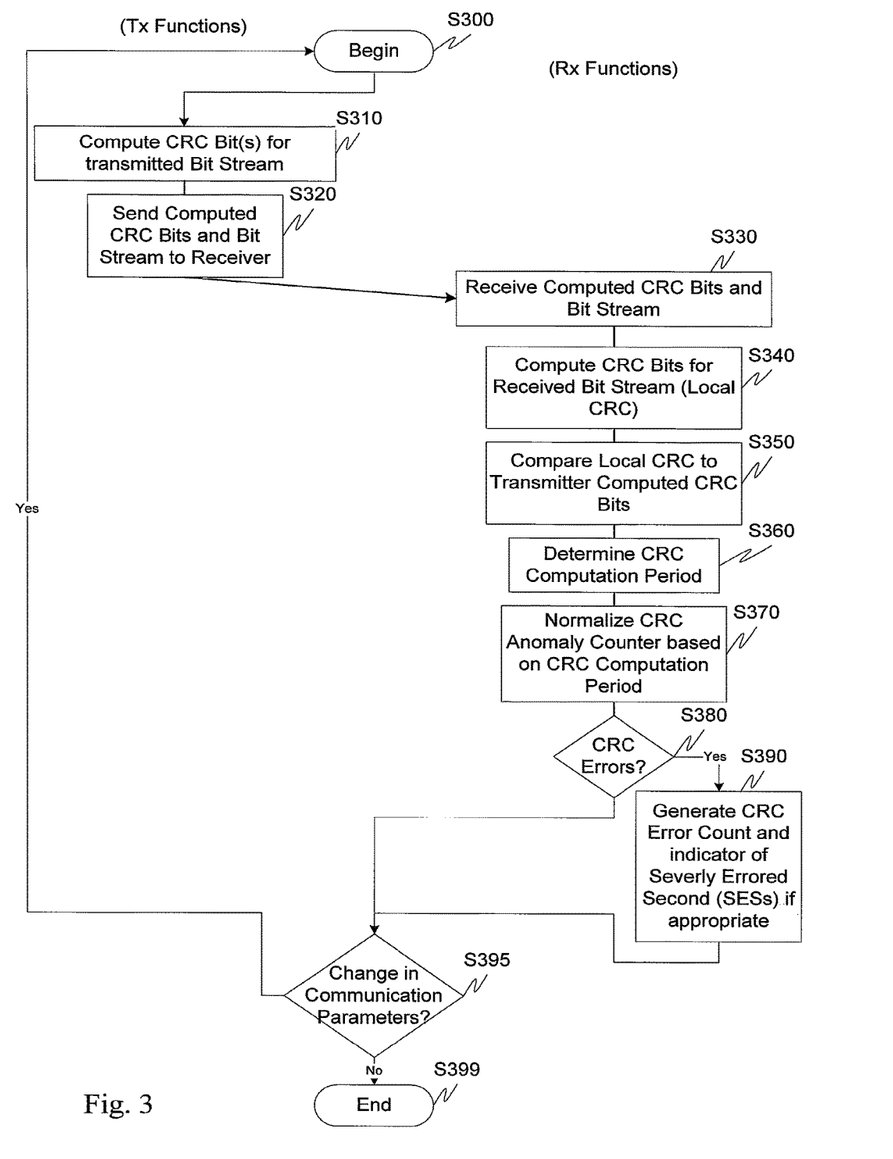
FIG. 3 is a flowchart outlining in greater detail an exemplary method of CRC normalization according to this invention.

FIG. 3 outlines an exemplary embodiment of CRC normalization in greater detail. In particular, control begins in step S300 and continues to step S310. In step S310 the transceiver, acting as a transmitter, determines the CRC bits for a transmitted bit stream. The transceiver then sends the determined CRC bits and bit stream to the receiver in step S320.

In step S330, another transceiver, acting in its receiving capacity, receives the determined CRC bits and bit stream. Next, in step S340, CRC bits are determined for the received bit stream (local CRC bits). Next, in step S350, the local CRC bits are compared to the CRC bits determined and forwarded by the transmitter. Control then continues to step S360.

In step S360, the CRC computation period is determined. Next, in step S370 the CRC anomaly counter is normalized based on the CRC computation period (PERp). Control then continues to step S380.

In step S380, a determination is made whether CRC errors or anomalies are present. If CRC errors are present, control continues to step S390 otherwise control jumps to step S395.

In step S390, the CRC error count is generated and an indicator of severely errored seconds reported, if appropriate. In addition to the reporting of severely errored seconds, it should be appreciated that alternative action could also be taken upon the determination of CRC errors. For example, Errored Seconds (ES) could be reported, where an errored second is typically defined as a second in which there is one or more CRC error events. Alternatively, CRC errors can be compiled over periods of time other than seconds, such as minutes, hours or sub-second intervals.

In step S395, a determination is made whether there has been a change in communication parameters. If there has been a change in one or more communication parameters, control jumps back to step S300 and the process repeated where a second or updated CRC computation period is determined in step S360. If there has not been a change in one or more communications parameters, control continues to step S399 where the control sequence ends.

Figure 4:
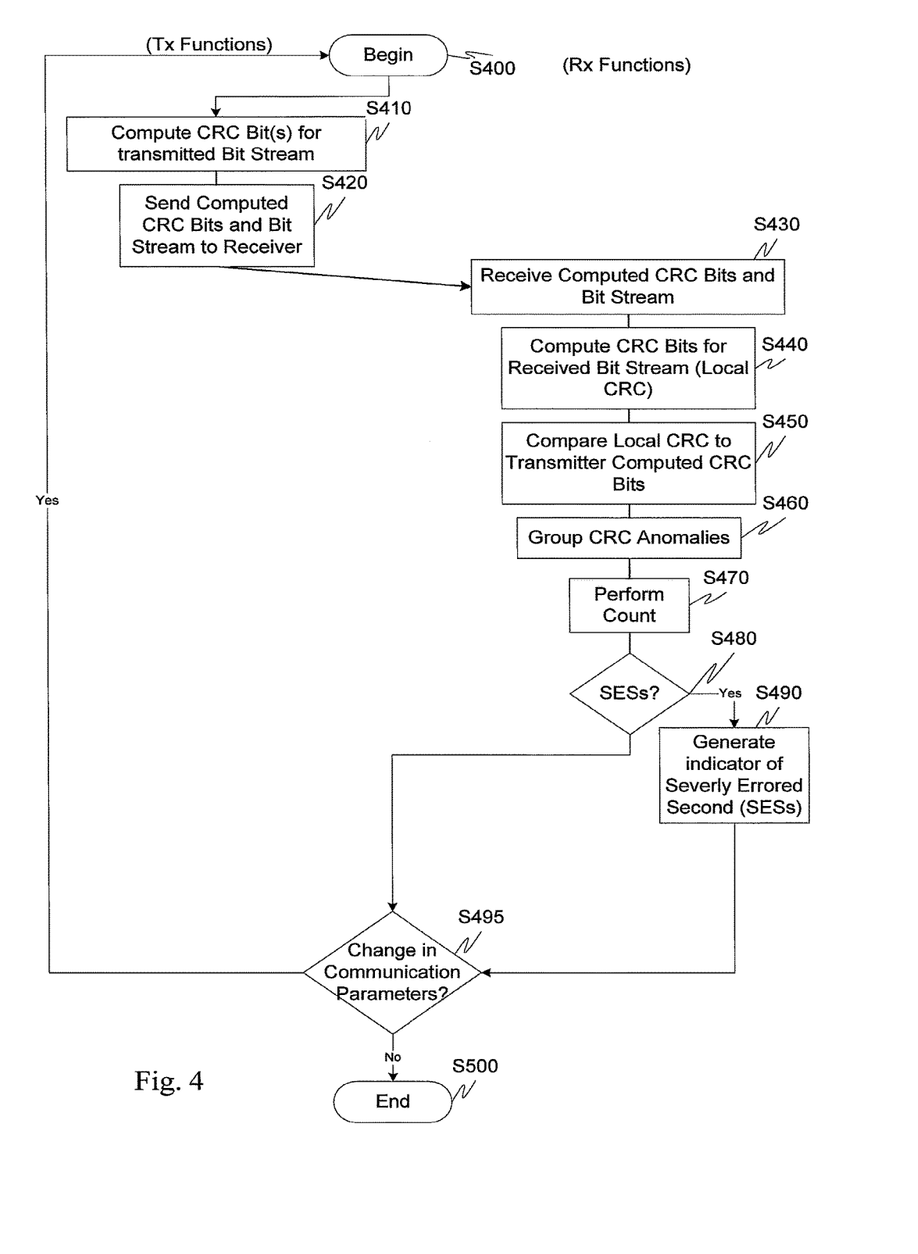
FIG. 4 is another exemplary embodiment for normalizing CRC normalization according to this invention.

FIG. 4 outlines another exemplary embodiment of CRC normalization according to this invention. In particular, control begins in step S400 and continues to step S410. In step S410 the transceiver, acting its capacity as a transmitter, determines the CRC bits for a transmitted bit stream. The transceiver then sends the determined CRC bits and bit stream to the receiver in step S420.

In step S430, another transceiver, acting in its receiving capacity, receives the determined CRC bits and bit stream. Next, in step S440, CRC bits are determined for the received bit stream (local CRC bits). Next, in step S450, the local CRC bits are compared to the CRC bits determined and forwarded by the transmitter. Control then continues to step S460.

In step S460, the CRC anomalies are grouped. Next, in group S470 a count is performed with control continuing in step S480. In step S480, a determination is made whether severely errored seconds are present. If severely errored seconds are present, control continues to step S490.

In step S490, an indicator of severely errored seconds is generated and, for example, forwarded to an appropriate destination or an action triggered.

In step S495, a determination is made whether there has been a change in communication parameters. If there has been a change in one or more communication parameters, control jumps back to step S400 and the process repeated where an updated grouping is performed in step S460. If there has not been a change in one or more communications parameters, control continues to step S500 where the control sequence ends.

It should be appreciated that while certain functionality described herein is illustratively performed in one or more of the transceiver 100 and transceiver 200 that some or all of the steps can be performed in any apparatus that may or may not be colocated with one or more of the transceiver 100 and transceiver 200. For example, the functionality performed by the PERp determination module and normalization module can be outsourced to another module with the normalization value forwarded back to and applied to the CRC error counter and reporting module 240. Moreover, the sequences of events described herein are for illustrative purposes only and may also be rearranged as appropriate.

Figure 5:
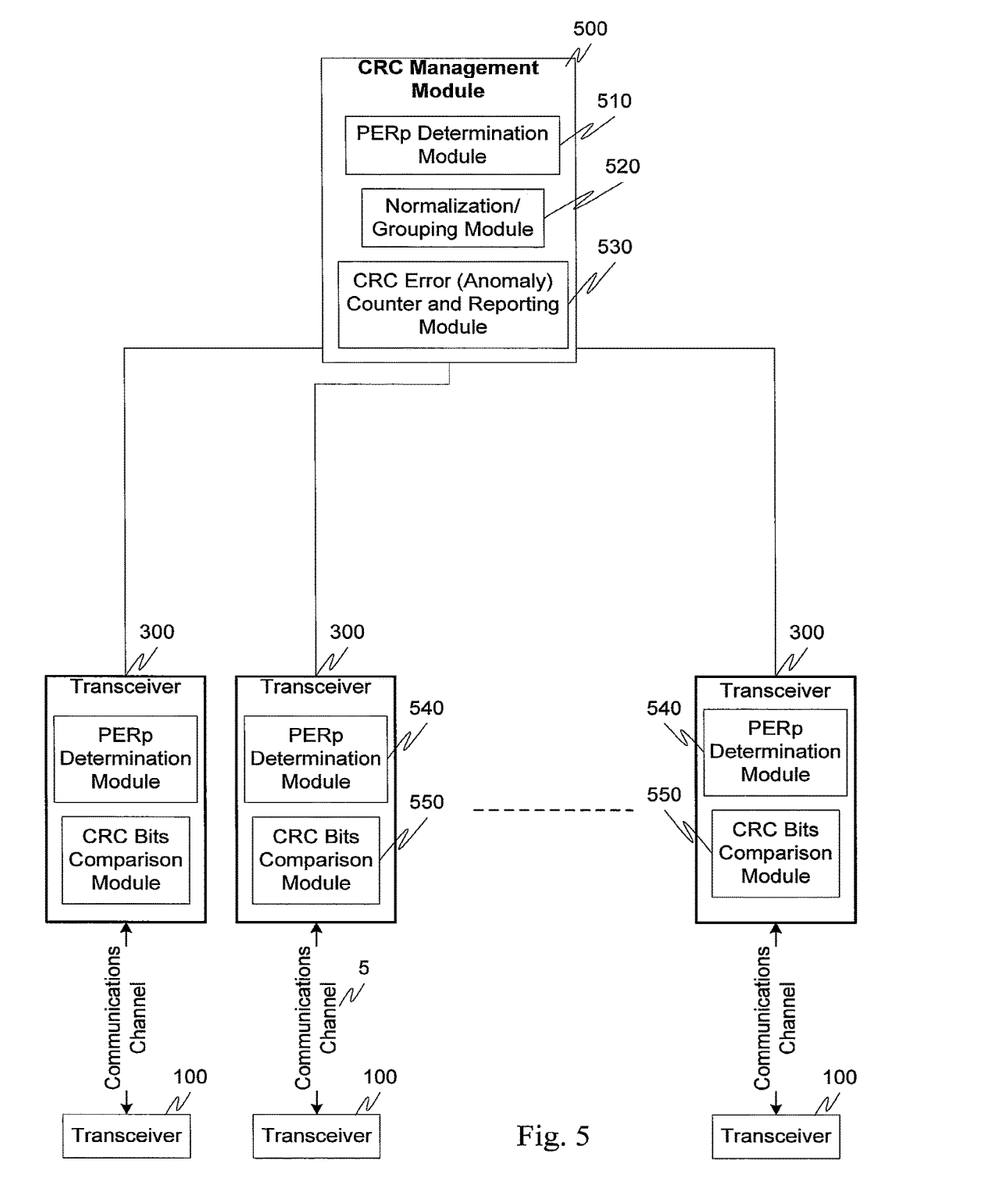
FIG. 5 is a functional block diagram illustrating a second exemplary communication system according to this invention.

More particularly, FIG. 5 illustrates an exemplary embodiment of a CRC normalization management system. As with the communication system 10, the CRC normalization management system includes one or more transceivers 100 each connected, via a communications channel, to the one or more transceivers 300. Each of the transceivers 300 are in communication with the CRC management module 500. The CRC management module 500 includes a PERp determination module 510, a normalization and/or grouping module 520 and a CRC error counter and reporting module 530. The CRC management module 500 at least allows normalization and/or grouping of one or more CRC error counts from a centralized location. For example, the CRC bits comparison modules 550 forward and indicator of a CRC error(s) to the CRC management module 500. The transceiver 300 can also determine and forward a value for the period of a CRC computation (PERp) with the cooperation of the PERp determination module 540. The management module, if needed, and with the cooperation of the PERp determination module 510, can also determine a value for the period of a CRC computation (PERp) for each of the one or more transceivers 300.

Having received a report of one or more errors from the one or more CRC bits comparison modules 550, the normalization/grouping module updates the CRC error counter and reporting module 530 based on this value. In that each transceiver could be operating under different communication parameters, the values used to update the CRC error counter 550 could be transceiver specific, applied to a portion of the transceivers or to all transceivers. The CRC error counter and reporting module 530 could then output, as discussed above, a normalized CRC error count. For example, an indicator of severely errored seconds could be generated and, for example, forwarded to an appropriate destination or an action triggered.

The above-described system can be implemented on wired and/or wireless telecommunications devices, such a modem, a multicarrier modem, a DSL modem, an ADSL modem, an XDSL modem, a VDSL modem, a linecard, test equipment, a multicarrier transceiver, a wired and/or wireless wide/local area network system, a satellite communication system, a modem equipped with diagnostic capabilities, or the like, or on a separate programmed general purpose computer having a communications device or in conjunction with any of the following communications protocols: CDSL, ADSL2, ADSL2+, VDSL1, VDSL2, HDSL, DSL Lite, IDSL, RADSL, SDSL, UDSL or the like.

Additionally, the systems, methods and protocols of this invention can be implemented on a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device such as PLD, PLA, FPGA, PAL, a modem, a transmitter/receiver, any comparable means, or the like. In general, any device capable of implementing a state machine that is in turn capable of implementing the methodology illustrated herein can be used to implement the various communication methods, protocols and techniques according to this invention.

Furthermore, the disclosed methods may be readily implemented in software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this invention is dependent on the speed and/or efficiency requirements of the system, the particular function, and the particular software or hardware systems or microprocessor or microcomputer systems being utilized. The communication systems, methods and protocols illustrated herein however can be readily implemented in hardware and/or software using any known or later developed systems or structures, devices and/or software by those of ordinary skill in the applicable art from the functional description provided herein and with a general basic knowledge of the computer and telecommunications arts.

Moreover, the disclosed methods may be readily implemented in software that can be stored on a storage medium, executed on programmed general-purpose computer with the cooperation of a controller and memory, a special purpose computer, a microprocessor, or the like. In these instances, the systems and methods of this invention can be implemented as program embedded on personal computer such as JAVA® or CGI script, as a resource residing on a server or computer workstation, as a routine embedded in a dedicated communication system or system component, or the like. The system can also be implemented by physically incorporating the system and/or method into a software and/or hardware system, such as the hardware and software systems of a communications transceiver.

It is therefore apparent that there has been provided, in accordance with the present invention, systems and methods for CRC normalization. While this invention has been described in conjunction with a number of embodiments, it is evident that many alternatives, modifications and variations would be or are apparent to those of ordinary skill in the applicable arts. Accordingly, it is intended to embrace all such alternatives, modifications, equivalents and variations that are within the spirit and scope of this invention.

The invention claimed is:

1. A method in transceiver, the method comprising:
determining a first value for a CRC computation period based on a first communication parameter value;
calculating a first number of normalized CRC anomalies based on the first value for the CRC computation period;
declaring a severely errored second when the first number of normalized CRC anomalies in a one second interval is 18 or greater than 18.

2. The method of claim 1, further comprising:
determining a second value for the CRC computation period based on a second communication parameter value, different than the first communication parameter value, wherein the first value for the CRC computation period is different that the second value for the CRC computation period;
calculating a second number of normalized CRC anomalies based on the second value for the CRC computation period; and
declaring a severely errored second when the second number of normalized CRC anomalies in a one second interval is 18 or greater than 18.

3. The method of claim 2, wherein calculating the second number of normalized CRC comprises incrementing a CRC anomaly counter by a value of M wherein the value M is equal to PERp/K, where K is a positive integer and PERp is the value of the second CRC computation period.

4. The method of claim 3, wherein K is equal to 20 or 15.

5. The method of claim 1 wherein the first communication parameter value is a data rate parameter value.

6. The method of claim 1 wherein the first communication parameter e is a Forward Error Correction parameter value.

7. The method of claim 1 wherein the first communication parameter value is an interleaving parameter value.

8. The method of claim 1 wherein the first communication parameter value is a framing parameter value.

9. The method of claim 1 wherein calculating the first number of normalized CRC comprises incrementing a CRC anomaly counter by a value of M wherein the value M is equal to PERp/K, where K is a positive integer and PERp is the value of the first CRC computation period.

10. The method of claim 9, wherein K is equal to 20 or 15.

11. A transceiver comprising:
a controller and memory in the transceiver operable to determine a first value for a CRC computation period based on a first communication parameter value;
a CRC anomaly counter operable to calculate a first number of normalized CRC anomalies based on the first value for the CRC computation period;
a CRC anomaly reporter, cooperating with the controller and memory, operable to declare a severely errored second when the first number of normalized CRC anomalies in a one second interval is 18 or greater than 18.

12. The transceiver of claim 11, further comprising:
the controller and memory in the transceiver further operable to determine a second value for the CRC computation period based on a second communication parameter value, different than the first communication parameter value, wherein the first value for the CRC computation period is different that the second value for the CRC computation period;
the CRC anomaly counter further operable to calculate a second number of normalized CRC anomalies based on the second value for the CRC computation period; and
the CRC anomaly reporter, cooperating with the controller and memory, further operable to declare a severely errored second when the second number of normalized CRC anomalies in a one second interval is 18 or greater than 18.

13. The transceiver of claim 11, wherein the first communication parameter value is a data rate parameter value.

14. The transceiver of claim 11, wherein the first communication parameter value is a Forward Error Correction parameter value.

15. The transceiver of claim 11, wherein the first communication parameter value is an interleaving parameter value.

16. The transceiver of claim 11, wherein the first communication parameter value is a framing parameter value.

17. The transceiver of claim 11, wherein calculating a first number of normalized CRC comprises incrementing a CRC anomaly counter by a value of M wherein the value M is equal to PERp/K, where K is a positive integer and PERp is the value of the first CRC computation period.

18. The transceiver of claim 17, wherein K is equal to 20 or 15.

19. The transceiver of claim 11, wherein calculating a second number of normalized CRC comprises incrementing a CRC anomaly counter by a value of M wherein the value M is equal to PERp/K, where K is a positive integer and PERp is the value of the second CRC computation period.

20. The transceiver of claim 19, wherein K is equal to 20 or 15.

* * * * *